(12) United States Patent
Kim et al.

(10) Patent No.: US 9,910,332 B2
(45) Date of Patent: Mar. 6, 2018

(54) DISPLAY DEVICE

(71) Applicant: SAMSUNG DISPLAY CO., LTD., Yongin-si (KR)

(72) Inventors: Wonho Kim, Seongnam-si (KR); Seongsu Lim, Seoul (KR); Taehyung Hwang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 48 days.

(21) Appl. No.: 14/972,263

(22) Filed: Dec. 17, 2015

(65) Prior Publication Data

US 2016/0327845 A1 Nov. 10, 2016

(30) Foreign Application Priority Data

May 8, 2015 (KR) .................. 10-2015-0064325

(51) Int. Cl.
*G02F 1/1362* (2006.01)
*H01L 27/12* (2006.01)
*G02F 1/1368* (2006.01)
*G02F 1/1343* (2006.01)
*G02F 1/1337* (2006.01)

(52) U.S. Cl.
CPC ...... *G02F 1/136286* (2013.01); *G02F 1/1337* (2013.01); *G02F 1/1368* (2013.01); *G02F 1/13624* (2013.01); *G02F 1/134309* (2013.01); *G02F 1/134363* (2013.01); *H01L 27/124* (2013.01); *G02F 2001/133742* (2013.01); *G02F 2001/134318* (2013.01);

(Continued)

(58) Field of Classification Search
CPC ................................. G02F 1/136286
See application file for complete search history.

(56) References Cited

U.S. PATENT DOCUMENTS

| 2002/0067448 A1 | 6/2002 | Kim et al. |
| 2009/0174854 A1 | 7/2009 | Park |

(Continued)

FOREIGN PATENT DOCUMENTS

| KR | 1020060077883 | 7/2006 |
| KR | 1020130038486 | 10/2011 |

(Continued)

OTHER PUBLICATIONS

Extended European Search Report for Application No. 16165473.6 dated Sep. 14, 2016.

*Primary Examiner* — Edmond Lau
(74) *Attorney, Agent, or Firm* — Cantor Colburn LLP

(57) ABSTRACT

A display device, enhanced in luminance uniformity by forming a horizontal electric field and a fringe electric field, includes a first substrate, a first gate line on the first substrate, first and second data lines intersecting the first gate line, a first thin film transistor connected to the first gate line and the first data line, a second thin film transistor connected to the first gate line and the second data line, a first passivation layer on the first and second thin film transistors, a lower common electrode on the first passivation layer, a second passivation layer covering the lower common electrode, and a first pixel electrode including a first sub-pixel electrode connected to the first thin film transistor and a second sub-pixel electrode connected to the second thin film transistor.

19 Claims, 11 Drawing Sheets

(52) U.S. Cl.
CPC ............ *G02F 2001/134345* (2013.01); *G02F 2001/134372* (2013.01); *G02F 2203/30* (2013.01)

(56) References Cited

U.S. PATENT DOCUMENTS

| | | | |
|---|---|---|---|
| 2010/0053484 A1* | 3/2010 | Ono | G02F 1/134363 349/37 |
| 2010/0103085 A1* | 4/2010 | Lee | G02F 1/134363 345/92 |
| 2010/0225839 A1 | 9/2010 | Kim et al. | |
| 2012/0099037 A1* | 4/2012 | Park | G02F 1/13624 349/33 |
| 2012/0169982 A1 | 7/2012 | Chuang et al. | |
| 2013/0321752 A1* | 12/2013 | Asakawa | G02F 1/1337 349/128 |
| 2014/0016075 A1 | 1/2014 | Iwata et al. | |
| 2014/0307206 A1* | 10/2014 | Xie | G02F 1/133555 349/96 |
| 2016/0161809 A1* | 6/2016 | Murata | G02F 1/134363 349/33 |
| 2016/0170271 A1* | 6/2016 | Takeda | G02F 1/134309 349/106 |

FOREIGN PATENT DOCUMENTS

| | | |
|---|---|---|
| KR | 1020130056694 | 5/2013 |
| WO | 2014065202 A1 | 5/2014 |

\* cited by examiner

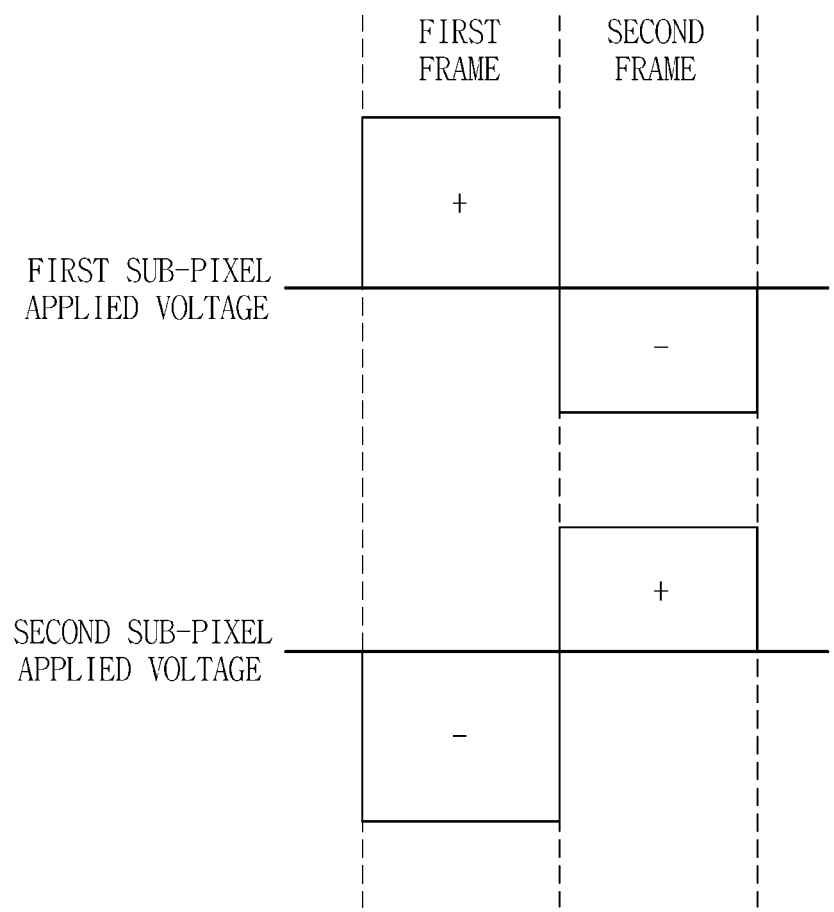

DISPLAY DEVICE

This application claims priority to Korean Patent Application No. 10-2015-0064325, filed on May 8, 2015, and all the benefits accruing therefrom under 35 U.S.C. §119, the content of which in its entirety is incorporated herein by reference.

BACKGROUND

1. Field

Exemplary embodiments of the invention relate to a display device, and more particularly, to a display device enhanced in regard to luminance uniformity.

2. Description of the Related Art

A liquid crystal display ("LCD") device is a type of flat panel display ("FPD") devices that have gained wide acceptance recently. An LCD device includes two substrates having electrodes formed thereon and a liquid crystal ("LC") layer interposed therebetween. In such an LCD device, LC molecules of the LC layer are rearranged by voltages that are applied to the two electrodes, and thereby adjusting the amount of transmitted light and displaying an image on the LCD device.

In addition, an organic light emitting diode ("OLED") display device is garnering attention as a flexible display device as well as an FPD device due to the absence of a backlight unit and manufacturability into a thin-film stacked structure, dissimilarly to an LCD device.

SUMMARY

Exemplary embodiments of embodiments of the invention are directed to a display device capable of providing an image enhanced in regard to luminance uniformity.

According to an exemplary embodiment of the invention, a display device includes a first substrate, a first gate line on the first substrate, first and second data lines intersecting the first gate line, a first thin film transistor ("TFT") connected to the first gate line and the first data line, a second TFT connected to the first gate line and the second data line, a first passivation layer on the first and second TFTs, a lower common electrode on the first passivation layer, a second passivation layer covering the lower common electrode, and a first pixel electrode including a first sub-pixel electrode connected to the first TFT and a second sub-pixel electrode connected to the second TFT, wherein at least a portion of the first sub-pixel electrode and at least a portion of the second sub-pixel electrode each overlap the lower common electrode.

In an exemplary embodiment, the first and second sub-pixel electrodes may each overlap an edge of the lower common electrode.

In an exemplary embodiment, the first sub-pixel electrode may overlap the lower common electrode by less than half a width of the first sub-pixel electrode, and the second sub-pixel electrode may overlap the lower common electrode by less than half a width of the second sub-pixel electrode.

In an exemplary embodiment, the lower common electrode may be absent in an area between the first and second sub-pixel electrodes.

In an exemplary embodiment, the lower common electrode may overlap the first and second data lines.

In an exemplary embodiment, the lower common electrode may not overlap the first and second TFTs.

In an exemplary embodiment, the lower common electrode may have a width wider than a width of each of the first and second sub-pixel electrodes.

In an exemplary embodiment, a width of each of the first and second sub-pixel electrodes may be smaller than an interval between the first and second sub-pixel electrodes.

In an exemplary embodiment, the first and second sub-pixel electrodes may be disposed on a same layer while being adjacent to one another.

In an exemplary embodiment, the first and second sub-pixel electrodes may be substantially parallel to one another.

In an exemplary embodiment, the first and second sub-pixel electrodes may receive voltages having a same level and different polarities.

In an exemplary embodiment, the display device may further include a second substrate opposing the first substrate, a liquid crystal ("LC") layer between the first substrate and the second substrate, and an upper common electrode on the second substrate.

In an exemplary embodiment, the LC layer may be a hometropic alignment layer.

In an exemplary embodiment, the LC layer may have a negative dielectric anisotropy.

In an exemplary embodiment, the display device may further include a second gate line substantially parallel to the first gate line, a third data line opposing the first data line while having the second data line therebetween, a third TFT connected to the second data line and the second gate line, a fourth TFT connected to the second gate line and the third data line, and a second pixel electrode including a third sub-pixel electrode connected to the third TFT and a fourth sub-pixel electrode connected to the fourth TFT.

In an exemplary embodiment, the second gate line may be disposed to overlap an end portion of the the first sub-pixel electrode and an end portion of the second sub-pixel electrode.

In an exemplary embodiment, the third TFT and the fourth TFT may not overlap the lower common electrode.

In an exemplary embodiment, the lower common electrode may overlap the third data line.

The foregoing is illustrative only and is not intended to be in any way limiting. In addition to the illustrative exemplary embodiments, embodiments, and features described above, further exemplary embodiments, embodiments, and features will become apparent by reference to the drawings and the following detailed description.

BRIEF DESCRIPTION OF THE DRAWINGS

The above and other features and exemplary embodiments of the invention of invention will be more clearly understood from the following detailed description taken in conjunction with the accompanying drawings, in which:

FIG. 4B is a waveform view illustrating a voltage applied to a pixel according to an exemplary embodiment;

DETAILED DESCRIPTION

Figure 1:
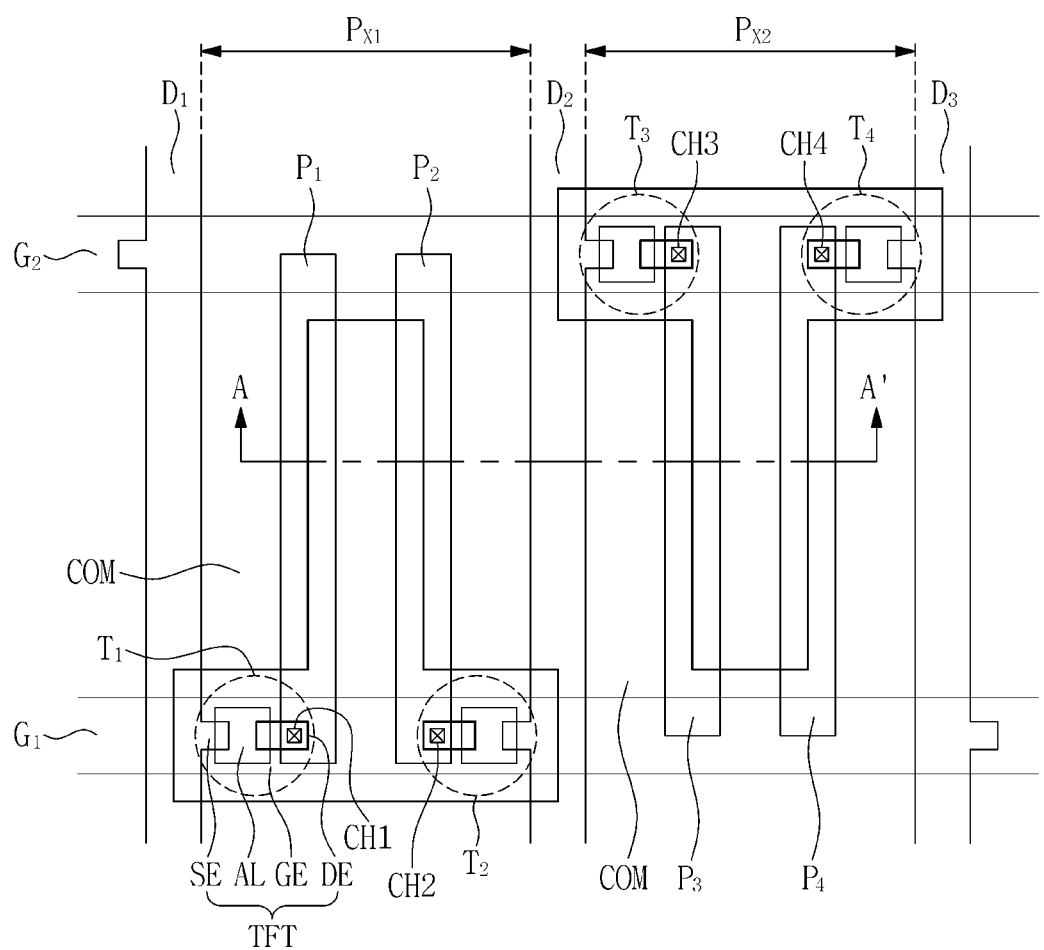
FIG. 1 is a plan view illustrating a portion of a display area of a display device according to an exemplary embodiment.

Advantages and features of the invention and methods for achieving them will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the exemplary embodiments in order to prevent the invention from being obscurely interpreted. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

All terminologies used herein are merely used to describe exemplary embodiments and can be modified according to the relevant art and the intention of an applicant. Therefore, the terms used herein should be interpreted as having a meaning that is consistent with their meanings in the context of the disclosure, and is not intended to limit the exemplary embodiments. As used herein, the singular forms "a," "an," and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have the same meaning as commonly understood by those skilled in the art. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an exemplary embodiment with respect to a display device will be described with reference to FIGS. 1, 2, 3, 4A, and 4B.

Figure 2:
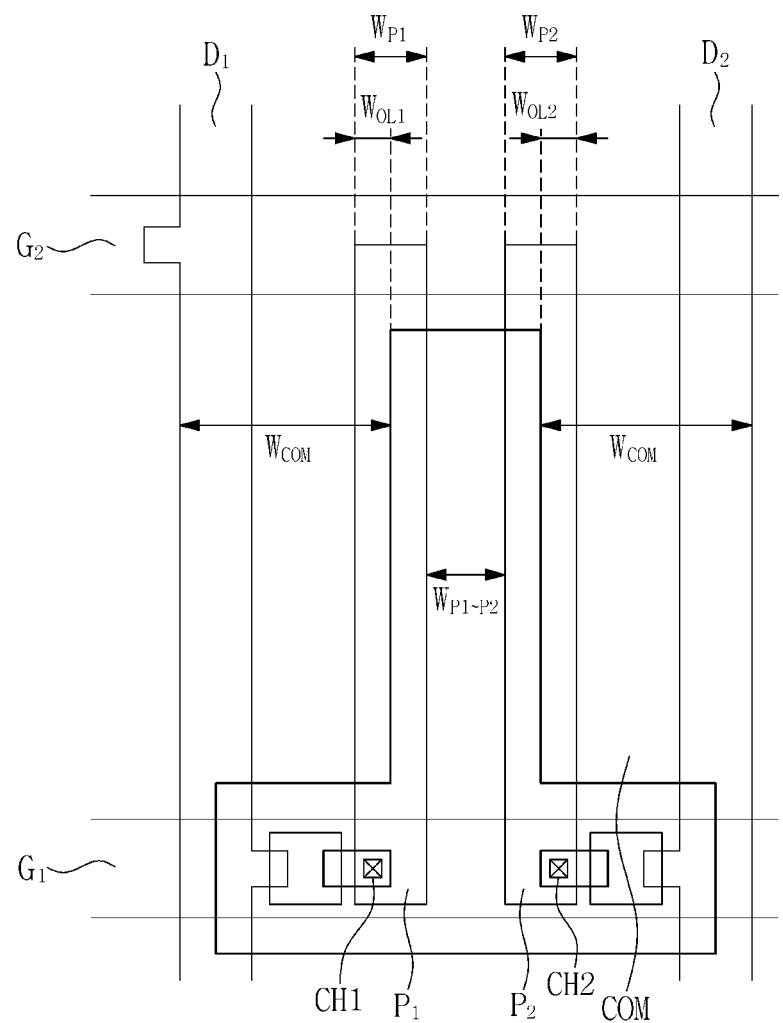
FIG. 2 is a plan view illustrating a pixel of a display device according to an exemplary embodiment.
Figure 3:
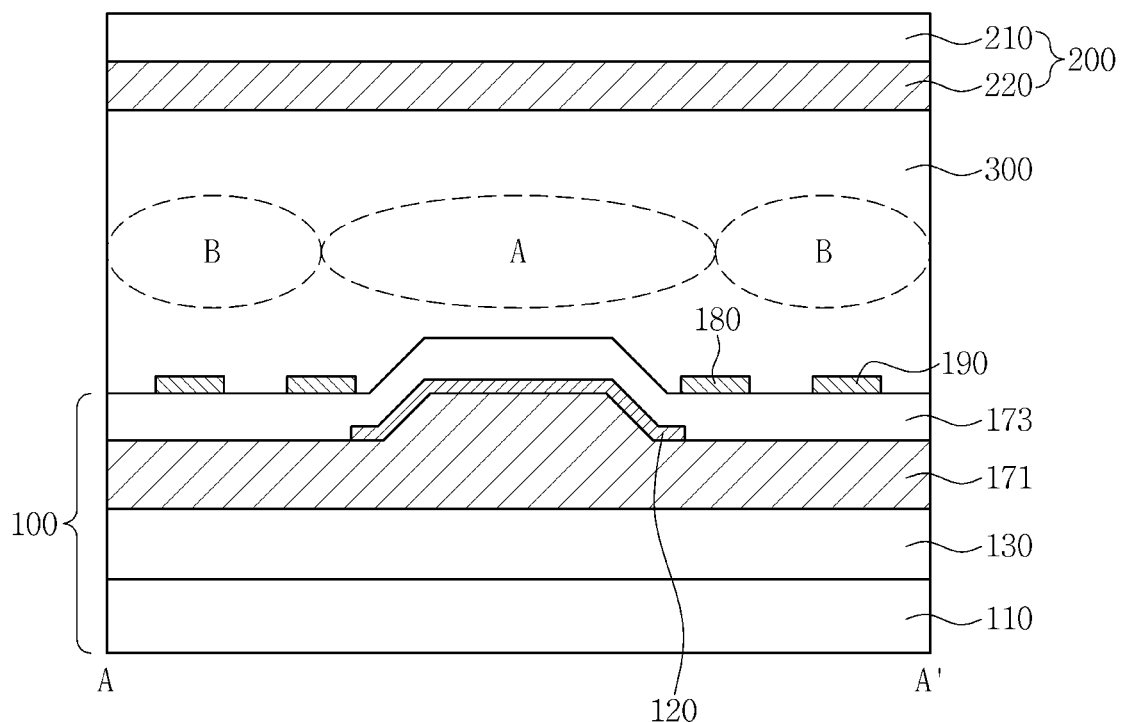
FIG. 3 is a cross-sectional view taken along line A-A' of FIG. 1.
Figure 4A:
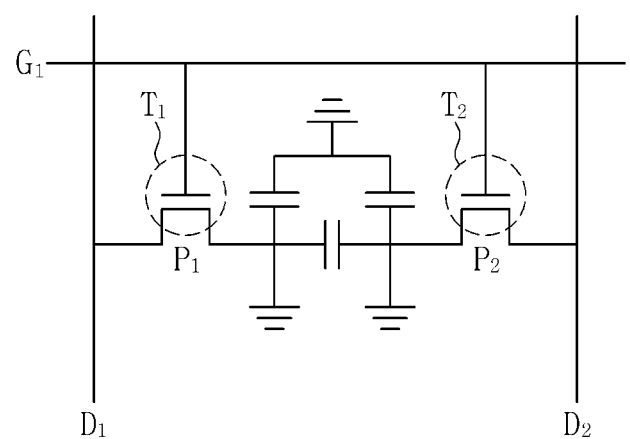
FIG. 4A is a circuit diagram illustrating a pixel according to an exemplary embodiment.

FIG. 1 is a plan view illustrating a portion of a display area of the display device according to the exemplary embodiment. FIG. 2 is a plan view illustrating a pixel of the display device according to the exemplary embodiment. FIG. 3 is a cross-sectional view taken along line A-A' of FIG. 1. FIG. 4A is a circuit diagram of a pixel of the display device according to the exemplary embodiment. FIG. 4B is a waveform view of a voltage applied to a pixel according to the exemplary embodiment.

FIG. 1 illustrates two pixels $P_{x1}$ and $P_{x2}$, four sub-pixel electrodes $P_1$, $P_2$, $P_3$, and P4 and four thin film transistors ("TFTs") $T_1$, $T_2$, $T_3$, and $T_4$ to describe a disposition relationship between two adjacent pixel electrodes, that is, four adjacent sub-pixel electrodes.

Referring to FIG. 1, the display device according to the exemplary embodiment may include a first gate line $G_1$ on a substrate, a second gate line $G_2$ adjacent to the first gate line $G_1$ while being substantially parallel thereto, first and second data lines $D_1$ and $D_2$ intersecting the first gate line $G_1$, a third data line $D_3$ opposing the first data line $D_1$ with reference to the second data line $D_2$ therebetween, a first TFT $T_1$ connected to the first gate line $G_1$ and the first data line $D_1$, a second TFT $T_2$ connected to the first gate line $G_1$ and the second data line $D_2$, a third TFT $T_3$ connected to the second gate line $G_2$ and the second data line $D_2$, a fourth TFT $T_4$ connected to the second gate line $G_2$ and the third data line $D_3$, a lower common electrode COM on a first passivation layer 171, a first pixel electrode including a first sub-pixel electrode $P_1$ connected to the first TFT $T_1$ and a second sub-pixel electrode $P_2$ connected to the second TFT $T_2$, and a second pixel electrode including a third sub-pixel electrode $P_3$ connected to the third TFT $T_3$ and a fourth sub-pixel electrode $P_4$ connected to the fourth TFT $T_4$.

As illustrated in FIG. 1, the two adjacent pixels $P_{x1}$ and $P_{x2}$, that is, a first pixel $P_{x1}$ and a second pixel $P_{x2}$, may be point-symmetric to one another. Since the first pixel $P_{x1}$ and the second pixel $P_{x2}$ have the same configuration aside from the point-symmetric relationship therebetween, the display device according to the exemplary embodiment will be mainly described with regard to the first pixel $P_{x1}$.

A pixel, for example, the first pixel $P_{x1}$, of the display device according to the exemplary embodiment may include the two data lines $D_1$ and $D_2$, the two TFTs $T_1$ and $T_2$, the two sub-pixel electrodes $P_1$ and $P_2$, and the lower common electrode COM that are disposed thereon.

A detailed description pertaining to the structure of the display device according to the exemplary embodiment will be provided hereinbelow.

Referring to FIGS. 1, 2, and 3, the plurality of gate lines $G_1$ may be disposed on the substrate including a transparent material such as glass or plastic, for example.

The gate line $G_1$ may transmit a gate signal and may substantially extend in a transverse direction. Each of the gate lines $G_1$ may include a plurality of gate electrodes GE disposed thereon.

A gate insulating layer 130 may be disposed on the gate line GL. In an exemplary embodiment, the gate insulating layer 130 may include silicon nitride ($SiN_x$), silicon oxide ($SiO_x$), or the like, for example. A plurality of semiconductor layers AL may be disposed on the gate insulating layer 130. In an exemplary embodiment, the plurality of semiconductor layers AL may include hydrogenated amorphous silicon (a-Si), polycrystalline silicon, or the like, for example.

A plurality of ohmic contact members (not illustrated) may be disposed on the semiconductor layer AL. In an exemplary embodiment, the ohmic contact member may include silicide or n+ hydrogenated amorphous silicon doped with high concentration n-type impurities such as phosphorus. The ohmic contact members may be disposed on the semiconductor layer AL, in pairs.

The plurality of data lines $D_1$ and $D_2$ and a plurality of drain electrodes DE may be disposed on the ohmic contact member and the gate insulating layer 130.

The data lines $D_1$ and $D_2$ may transmit a data signal and may substantially extend in a longitudinal direction to intersect the gate lines $G_1$ and $G_2$. The data lines $D_1$ and $D_2$ may each include a source electrode SE which extends toward the gate electrode GE.

The drain electrode DE may be separated from the data lines $D_1$ and $D_2$, and may face the source electrode SE on the gate electrode GE.

A gate electrode GE, a source electrode SE, and a drain electrode DE, along with a semiconductor layer AL, may form a TFT. A channel of the TFT may be formed in the semiconductor layer AL between the source electrode SE and the drain electrode DE. As described above, a single pixel may include the two TFTs $T_1$ and $T_2$ disposed thereon.

The first passivation layer 171 may be disposed on the TFTs $T_1$ and $T_2$. The first passivation layer 171 may include an inorganic insulating material or an organic insulating material, and may have a flat surface. Examples of the inorganic insulating material may include silicon nitride ($SiN_x$) and silicon oxide ($SiO_x$). In an exemplary embodiment, the organic insulating material may have photosensitivity and a dielectric constant of about 4.0 or less. In an exemplary embodiment, the first passivation layer 171 may have a double-layer structure including a lower inorganic layer and an upper organic layer, such that an excellent insulating property of the organic layer may be achieved and damage to an exposed portion of the semiconductor layer AL may be significantly reduced. A plurality of contact holes through which the drain electrodes DE are exposed may be defined in the first passivation layer 171.

The lower common electrode COM may be disposed on the first passivation layer 171. In a case in which the first passivation layer 171 has a curvature, the lower common electrode COM may also have a curvature. In an alternative exemplary embodiment, the lower common electrode COM may have a planar shape, for example. Lower common electrodes COM disposed on adjacent pixels may be connected to one another to receive a predetermined level of a common voltage supplied externally of the display area.

The lower common electrode COM may overlap the data lines $D_1$ and $D_2$.

The lower common electrode COM may have an aperture in a portion thereof adjacent to the gate line $G_1$. Accordingly, the lower common electrode COM may not overlap the first and second TFTs $T_1$ and $T_2$.

In an exemplary embodiment, the lower common electrode COM may include a transparent conductive material such as indium-tin-oxide ("ITO"), indium-zinc-oxide ("IZO"), or the like, and may form an electric field, along with the pixel electrode.

In addition, the lower common electrode COM may overlap the data lines $D_1$ and $D_2$ and may be disposed over two pixel areas to thereby serve as a shielding common electrode which allows an electric field formed in a pixel not to affect an electric field of another adjacent pixel.

A second passivation layer 173 may be disposed to cover the lower common electrode COM. The second passivation layer 173 may be the same as or similar to the first passivation layer 171 in terms of the material included therein and the function thereof, aside from a difference in positions thereof. The second passivation layer 173 may include an inorganic insulating material or an organic insulating material, and may have a flat surface. In an exemplary embodiment, the second passivation layer 173 may have a double-layer structure including a lower inorganic layer and an upper organic layer, such that an excellent insulating property of the organic layer may be achieved and the lower common electrode COM may not be affected. A plurality of contact holes through which the drain electrodes DE are exposed may be defined in the second passivation layer 173.

In an exemplary embodiment, a plurality of pixel electrodes may be disposed on the second passivation layer 173. The pixel electrode may include the plurality of sub-pixel electrodes $P_1$ and $P_2$. In an exemplary embodiment, the sub-pixel electrodes $P_1$ and $P_2$ may include a transparent conductive material such as ITO, IZO, or the like.

Referring to FIG. 4A, the first sub-pixel electrode $P_1$ may be connected to the first TFT $T_1$, and the second sub-pixel electrode $P_2$ may be connected to the second TFT $T_2$.

In detail, the first sub-pixel electrode $P_1$ may be physically and/or electrically connected to a first drain electrode through a first contact hole CH1 and may receive a first data voltage from the first drain electrode. Similarly, the second sub-pixel electrode P$_2$ may be physically and/or electrically connected to a second drain electrode through a second contact hole, CH2 and may receive a second data voltage from the second drain electrode. Similarly, a third contact hole CH3 may receive the second data voltage from a third drain electrode, and a fourth contact hole CH4 may receive a third data voltage from a fourth drain electrode. A relationship between the first data voltage and the second data voltage will be described further below.

Referring to FIG. 1, the first sub-pixel electrode P$_1$ and the second sub-pixel electrode P$_2$ may be alternately formed at predetermined intervals, and may be substantially parallel to one another.

At least a portion of the first sub-pixel electrode P$_1$ and at least a portion of the second sub-pixel electrode P$_2$ may each overlap the lower common electrode COM. The first sub-pixel electrode P$_1$ and the second sub-pixel electrode P$_2$ may each overlap an edge of the lower common electrode COM by less than a half of a width of the sub-pixel electrode. Accordingly, as illustrated in FIG. 1, the lower common electrode COM may be absent in an area between the first sub-pixel electrode P$_1$ and the second sub-pixel electrode P$_2$.

FIG. 2 is a plan view illustrating the pixel P$_{x1}$ among the pixels illustrated in FIG. 1, and the disposition relationship among the lower common electrode COM, the first sub-pixel electrode P$_1$, and the second sub-pixel electrode P$_2$ will be described in greater detail with reference to FIG. 2.

In FIG. 2, W$_{COM}$ denotes a width of the lower common electrode COM, and W$_{P1}$ and W$_{P2}$ denote a width of the first sub-pixel electrode P$_1$ and a width of the second sub-pixel electrode P$_2$, respectively. W$_{P1-P2}$ denotes an interval between the first sub-pixel electrode P$_1$ and the second sub-pixel electrode P$_2$, and W$_{OL1}$ and W$_{OL2}$ denote an overlapping width between the lower common electrode COM and the first sub-pixel electrode P$_1$ and an overlapping width between the lower common electrode COM and the second sub-pixel electrode P$_2$, respectively.

Referring to FIG. 2, the lower common electrode COM may have a width greater than each of a width of the first sub-pixel electrode P$_1$ and a width of the second sub-pixel electrode P$_2$. In other words, the width W$_{COM}$ of the lower common electrode COM may be greater than each of the width Wp$_1$ of the first sub-pixel electrode P$_1$ and the width W$_{P2}$ of the second sub-pixel electrode P$_2$.

As previously described, the lower common electrode COM may overlap at least respective portions of the first sub-pixel electrode P$_1$ and the second sub-pixel electrode P$_2$. The first sub-pixel electrode P$_1$ and the second sub-pixel electrode P$_2$ may each overlap the lower common electrode COM by less than a half of the sub-pixel electrode.

The first sub-pixel electrode P$_1$ and the second sub-pixel electrode P$_2$ may be disposed on the same layer, that is, the second passivation layer 173, while being adjacent to one another. The first sub-pixel electrode P$_1$ and the second sub-pixel electrode P$_2$ may be connected to the first TFT and the second TFT, respectively, to thereby receive voltages having the same level and different polarities.

In an exemplary embodiment, the width Wp$_1$ of the first sub-pixel electrode P$_1$ and the width W$_{P2}$ of the second sub-pixel electrode P$_2$ may each be less than the interval W$_{P1-P2}$ between the first sub-pixel electrode P$_1$ and the second sub-pixel electrode P$_2$.

A horizontal electric field may be generated between the first sub-pixel electrode P$_1$ and the second sub-pixel electrode P$_2$, and thereby the display device is operated in an in-plane switching ("IPS") mode.

The width and the disposition relationship among the lower common electrode COM, the first sub-pixel electrode P$_1$, and the second sub-pixel electrode P$_2$ may be expressed by the followings formulas.

$$W_{COM} > W_{P1}$$

$$W_{COM} > W_{P2}$$

$$W_{OL1} \leq \tfrac{1}{2} * W_{P1}$$

$$W_{OL2} \leq \tfrac{1}{2} * W_{P2}$$

$$W_{P1-P2} > W_{P1}$$

$$W_{P1-P2} > W_{P2}$$

FIG. 3 is a cross-sectional view taken along line A-A' of FIG. 1, and a mimetic view illustrating the display device according to the exemplary embodiment.

The display device according to the exemplary embodiment may include a lower panel 100 including a lower common electrode 120 on a first substrate 110, a first sub-pixel electrode 180 and a second sub-pixel electrode 190. An upper panel 200 may include an upper common electrode 220 on a second substrate 210.

As previously described with reference to FIGS. 1 and 2, at least a portion of the first sub-pixel electrode 180 and a portion of the second sub-pixel electrode 190 may each overlap an edge of the lower common electrode 120, and the lower common electrode 120 may be absent in an area between the first sub-pixel electrode 180 and the second sub-pixel electrode 190.

Referring to FIG. 3, the display device according to the exemplary embodiment may include area "A" in which the lower common electrode 120 is disposed and the first sub-pixel electrode 180 and the second sub-pixel electrode 190 each of which has at least a portion overlapping the lower common electrode 120 are disposed, and area "B" in which the lower common electrode 120 is absent and the first sub-pixel electrode 180 and the second sub-pixel electrode 190 are disposed.

In area "A", the lower common electrode 120 and the first sub-pixel electrode 180 may be disposed to overlap one another to form a fringe electric field. In area "B", the first sub-pixel electrode 180 and the second sub-pixel electrode 190 may be disposed on the same layer while being adjacent to one another to form a horizontal electric field therebetween.

The display device according to the exemplary embodiment may include a liquid crystal ("LC") layer 300 horizontally aligned. The LC layer 300 may have a positive dielectric anisotropy or a negative dielectric anisotropy.

As illustrated in FIG. 3, the display device according to the exemplary embodiment may further include the upper common electrode 220.

The upper common electrode 220 may serve to reduce image retention by dispersing an electric field which is concentrated on end portions of the first sub-pixel electrode 180 and the second sub-pixel electrode 190.

In a case in which the display device according to the exemplary embodiment includes the upper common electrode 220, an LC having a negative dielectric constant may be used. Through the use of such an LC having a negative dielectric constant, in a case in which a voltage having the same level is applied to the lower common electrode 120 and the upper common electrode 220, the lower common electrode 120 may not be affected and the horizontal electric field formed between the first and second sub-pixel electrodes 180 and 190 may not be affected, and thus, the horizontal alignment of the LC may be maintained and image retention may be reduced.

In a case in which the display device according to the exemplary embodiment does not include the upper common electrode 220, the LC layer 300 may have a negative dielectric anisotropy or a positive dielectric anisotropy.

The voltage applied to the lower common electrode COM, the first sub-pixel electrode $P_1$ and the second sub-pixel electrode $P_2$, and an electric field formed thereby will be described hereinbelow with reference to FIGS. 4A and 4B.

FIG. 4A is a circuit diagram illustrating a pixel according to the exemplary embodiment.

Referring to FIG. 4A, the display device according to the exemplary embodiment may include two TFTs in a pixel, two sub-pixel electrodes connected to the two TFTs, respectively, and a lower common electrode disposed to overlap at least respective portions of the two sub-pixel electrodes.

As illustrated in FIG. 4A, a first sub-pixel electrode $P_1$ and a second sub-pixel electrode $P_2$ may be connected to a first TFT $T_1$ and a second TFT $T_2$, respectively, the first and second TFTs $T_1$ and $T_2$ differing from one another.

In other words, while a gate-on signal is applied through a gate line $G_1$, a first data signal may be applied to the first sub-pixel electrode $P_1$ and a data signal different from the first data signal may be applied to the second sub-pixel electrode $P_2$. The first sub-pixel electrode $P_1$ may receive a first data voltage from a first drain electrode of the first TFT $T_1$. Similarly, the second sub-pixel electrode $P_2$ may receive a second data voltage from a second drain electrode of the second TFT $T_2$.

The first sub-pixel electrode $P_1$ to which the first data voltage is applied, the second sub-pixel electrode $P_2$ to which the second data voltage is applied, and the lower common electrode COM may generate an electric field.

FIG. 4B is a waveform view illustrating a voltage of a pixel according to the exemplary embodiment.

Referring to FIG. 4B, the display device according to the exemplary embodiment may apply voltages having the same level and different polarities to two sub-pixel electrodes during a single frame.

In FIG. 4B, a first sub-pixel electrode applied voltage may indicate a data voltage applied to the first sub-pixel electrode $P_1$ based on a first data signal, and a second sub-pixel electrode applied voltage may indicate a data voltage applied to the second sub-pixel electrode $P_2$ based on a second data signal. In addition, a line formed in a vertical direction in FIG. 4B may indicate a point in time at which a gate-on voltage is applied to a gate line.

In a frame, the first sub-pixel electrode applied voltage may be applied to the first sub-pixel electrode $P_1$ based on a first data signal during a period of time in which the gate-on voltage is applied. When the gate-on voltage is applied to the second sub-pixel electrode $P_2$, a voltage having the opposite polarity to (hereinafter, referred to as "opposite polarity voltage") and the same level as that of the first sub-pixel electrode $P_1$ may be applied to the second sub-pixel electrode $P_2$.

In the display device according to the exemplary embodiment, the voltages having different polarities and the same level may be applied to the first sub-pixel electrode $P_1$ and the second sub-pixel electrode $P_2$, respectively, based on a common voltage applied to the lower common electrode COM.

In such a configuration of the display device as described above, different voltages may be applied to the first sub-pixel electrode $P_1$ and the second sub-pixel electrode $P_2$ to form a horizontal electric field therebetween, whereby the display device is operated in an IPS mode, and a fringe electric field may be formed between the first sub-pixel electrode $P_1$ and the lower common electrode COM or between the second sub-pixel electrode $P_2$ and the lower common electrode COM, whereby the display device is operated in a plane to line switching ("PLS") mode.

Accordingly, the display device according to the exemplary embodiment may control an LC by simultaneously generating the horizontal electric field and the fringe electric field in a single pixel.

As previously described with reference to FIGS. 1, 2, 3, 4A, and 4B, the display device according to the exemplary embodiment may display an image having uniform luminance by generating the horizontal electric field and the fringe electric field in a single pixel.

Hereinafter, a description pertaining to the luminance uniformity of the display device according to the exemplary embodiment will be provided with reference to FIGS. 5 and 6.

Figure 5:
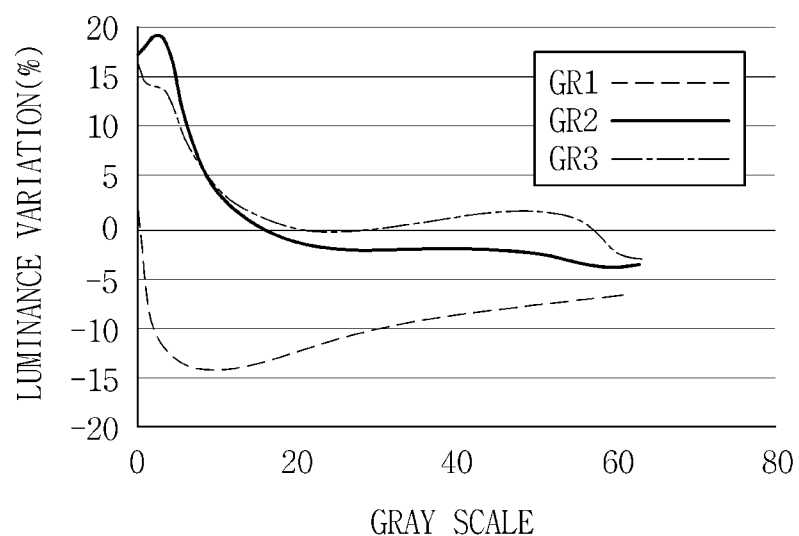
FIG. 5 illustrates graphs of a luminance variation based on a thickness variation in a passivation layer.

FIG. 5 is a graph illustrating a luminance variation with respect to a gray scale based on a thickness distribution in a passivation layer.

In FIG. 5, an x axis may represent a gray scale and a y axis may represent a luminance variation. A first graph GR1 may represent a result of measuring a luminance variation with respect to a gray scale of a conventional display device based on a thickness variation of about ±0.6 micrometers (μm) of a passivation layer. A second graph GR2 and a third graph GR3 may represent a result of measuring a luminance variation with respect to a gray scale of the display device according to the exemplary embodiment based on a thickness variation of about ±0.6 μm of the passivation layer.

Referring to FIG. 5, while the first graph GR1 exhibits a relatively great luminance variation with respect to a gray scale based on the thickness variation of the passivation layer, the second graph GR2 and the third graph GR3 exhibit a relatively small luminance variation with respect to a gray scale based on the thickness variation of the passivation layer. Accordingly, it may be appreciated that the luminance variation with respect to the gray scale of the display device according to the exemplary embodiment is less than that of the conventional display device.

In the display device according to the exemplary embodiment, the passivation layer may be absent in area "B" in which the lower common electrode is absent. Thus, the luminance variation with respect to the gray scale based on the thickness variation of the passivation layer may be decreased.

Figure 6:
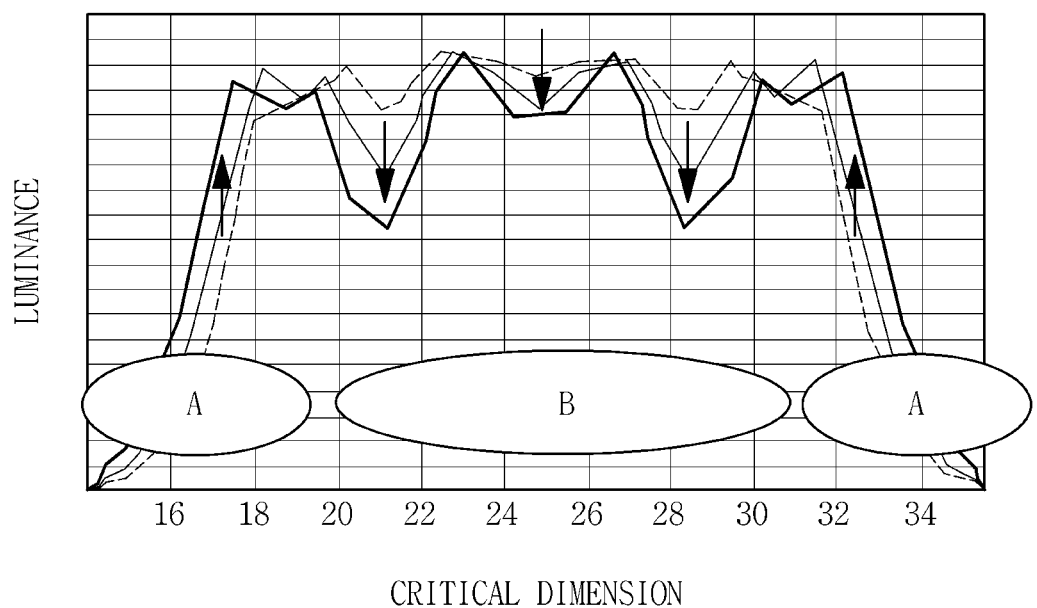
FIG. 6 illustrates graphs of a local luminance variation based on a critical dimension ("CD") variation in a pixel.

FIG. 6 illustrates graphs of a local luminance variation based on a critical dimension ("CD") variation in a pixel.

In FIG. 6, an x axis may represent a CD and a y axis may represent a luminance. The graphs illustrated in FIG. 6 may represent a simulation result of a local luminance variation based on an electric field formation scheme in a display area of the display device according to the exemplary embodiment.

As previously described with reference to FIG. 3, area "A" may indicate an area in which the lower common electrode is disposed and area "B" may indicate an area in which the lower common electrode is absent. Portions of FIG. 6 indicated by the arrows may each represent a luminance variation based on a CD variation.

Referring to FIG. 6, area "A" and area "B" exhibit opposite results of the luminance variation based on the CD variation. In other words, as a CD increases, a luminance may increase in area "A" whereas a luminance may decrease in area "B".

The display device according to the exemplary embodiment may include both of area "A" in which a luminance increases and area "B" in which a luminance decreases based on a CD variation within a pixel. Accordingly, the display device according to the exemplary embodiment may have a compensation effect with respect to the luminance increase and the luminance decrease based on a CD distribution.

The display device according to the exemplary embodiment may reduce the luminance variation based on the CD distribution by compensating for the luminance variation based on the presence of the lower common electrode.

Hereinafter, a display device according to another exemplary embodiment will be described with reference to FIGS. 7 and 8.

Figure 7:
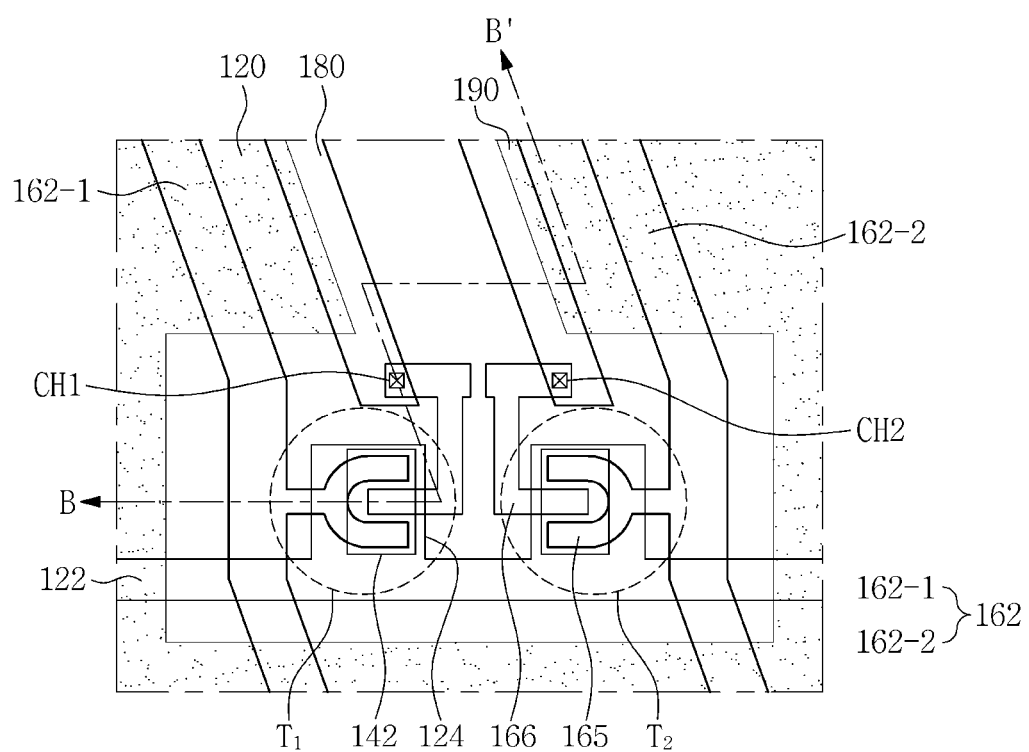
FIG. 7 is an enlarged view illustrating a portion of a pixel of a display device according to another exemplary embodiment.

FIG. 7 is an enlarged view illustrating a portion of a pixel of the display device according to another exemplary embodiment. FIG. 8 is a cross-sectional view taken along line B-B' of FIG. 7.

The display device according to another exemplary embodiment may include a first substrate 110, a first gate line 122 on the first substrate 110, first and second data lines 162-1 and 162-2 intersecting the first gate line 122, a first TFT $T_1$ connected to the first gate line 122 and the first data line 162-1, a second TFT $T_2$ connected to the first gate line 122 and the second data line 162-2, a first passivation layer 171 on the first and second TFTs $T_1$ and $T_2$, a planarization layer 175 on the first passivation layer 171, a lower common electrode 120 on the planarization layer 175, a second passivation layer 173 covering the lower common electrode 120, and a pixel electrode including a first sub-pixel electrode 180 connected to the first TFT $T_1$ and a second sub-pixel electrode 190 connected to the second TFT $T_2$. At least respective portions of the first and second sub-pixel electrodes 180 and 190 may overlap the lower common electrode 120.

The display device according to another exemplary embodiment may have the same configuration as that of the display device described with reference to FIG. 3, except that the display device according to the exemplary embodiment may further include the planarization layer 175 and may have a lower common electrode 120, having a planar shape rather than a curved shape, on the planarization layer 175. Accordingly, with regard to the display devices according to the exemplary embodiment and another exemplary embodiment, the same components and corresponding components are given the same reference numeral, the repetitive description will be omitted for conciseness.

A lower panel 100 may include the first substrate 110, a TFT 150 on the first substrate 110, the first passivation layer 171 on the TFT 150, the planarization layer 175 on the first passivation layer 171, the lower common electrode 120 on the planarization layer 175, the second passivation layer 173 on the lower common electrode 120, and the first and second sub-pixel electrodes 180 and 190 on the second passivation layer 173 while being adjacent to one another.

In an exemplary embodiment, the first substrate 110 may use an insulating substrate including a transparent material such as glass or plastic.

Gate wirings 122 and 124 transmitting a gate signal may be disposed on the first substrate 110. The gate wirings 122 and 124 may include a gate line 122 extending in a direction, for example, a transverse direction, and a gate electrode 124 protruding from the gate line 122 to have a protrusion shape. The gate electrode 124, along with a source electrode 165, a drain electrode 166, and a semiconductor layer 142, may constitute the TFT 150.

Although not illustrated, a storage wiring may further be disposed on the first substrate 110, the storage wiring for forming the pixel electrode, for example, the first and second sub-pixel electrodes 180 and 190, and a storage capacitor. The storage wiring may include the same material forming the gate wirings 122 and 124 and may be disposed on the same layer on which the gate wirings 122 and 124 are disposed.

In an exemplary embodiment, the gate wirings 122 and 124 may include at least one of an aluminum (Al) based metal such as Al or an Al alloy, a silver (Ag) based metal such as Ag or an Ag alloy, a copper (Cu) based metal such as Cu or an Cu alloy, a molybdenum (Mo) based metal such as Mo or a Mo alloy, chromium (Cr), titanium (Ti), and tantalum (Ta), for example.

The gate wirings 122 and 124 may have a multilayer structure including at least two conductive layers having different physical properties. In an exemplary embodiment, one of the two conductive layers may include a metal having relatively low resistivity, for example, an Al-based metal, an Ag-based metal or a Cu-based metal, so as to reduce a signal delay or a voltage drop of the gate wirings 122 and 124. In an exemplary embodiment, the other of the two conductive layers may include a material, for example, a Mo-based metal, Cr, Ti or Ta, which has an excellent contact characteristic with respect to a transparent conductive oxide ("TCO") such as indium-tin oxide ("ITO"), indium-zinc oxide ("IZO") or aluminum-zinc oxide ("AZO").

Examples of such a multilayer structure of the gate electrode 124 may include an electrode having a Cr lower layer and an Al upper layer, an electrode having an Al lower layer and a Mo upper layer, and an electrode having a Ti lower layer and a Cu upper layer. However, the exemplary embodiment is not limited thereto, and the gate wirings 122 and 124 may include various other metals and conductive materials.

A gate insulating layer 130 may be disposed on the first substrate 110 and the gate wirings 122 and 124. In an exemplary embodiment, the gate insulating layer 130 may include silicon oxide ($SiO_x$) or silicon nitride ($SiN_x$), for example. In addition, the gate insulating layer 130 may further include aluminum oxide, titanium oxide, tantalum oxide, or zirconium oxide. Even though FIG. 8 illustrates the gate insulating layer 130 having a double-layer structure, the structure of the gate insulating layer 130 is not limited thereto.

The semiconductor layer 142, which is provided to form a channel of the TFT 150, may be disposed on the gate insulating layer 130. At least a portion of the semiconductor layer 142 may overlap the gate electrode 124. In an exemplary embodiment, the semiconductor layer 142 may include an oxide semiconductor including at least one of gallium (Ga), indium (In), tin (Sn), and zinc (Zn), for example.

However, the exemplary embodiment is not limited thereto, and the semiconductor layer 142 may also include amorphous silicon (a-Si), for example. In other words, the semiconductor layer 142 may include a silicon-based semiconductor, for example.

An etch stopper ("ES") 168 including a predetermined insulating layer may be disposed between the source electrode 165 and the drain electrode 166 on a channel area of the semiconductor layer 142. The ES 168 may serve to prevent the channel area from being damaged by a subsequent process. In other words, the ES 168 may be disposed on the channel area of the semiconductor layer 142 to thereby prevent a contact between the channel area of the semiconductor layer 142 and a chemical material and prevent the exposure of the channel area to a wet or dry etching process and a plasma process during a subsequent process.

However, the structure of the TFT of the display device according to the exemplary embodiments is not limited to such an ES structure, and may also include a back channel etch ("BSE") structure.

Data wirings 162, 165, and 166 may be disposed on the ES 168 and the gate insulating layer 130. The data wirings 162, 165, and 166 may include a data line 162 disposed in a direction intersecting the gate line 122, for example, a longitudinal direction, the source electrode 165 corresponding to a portion of the data line 162 and disposed on the same line as the data line 162, and the drain electrode 166 spaced apart from the source electrode 165 and extending in parallel thereto based on the channel area of the TFT 150. Accordingly, the drain electrode 166 may be parallel to a portion of the data line 162.

The gate electrode 124, the source electrode 165, and the drain electrode 166, along with the semiconductor layer 142, may constitute a TFT 150. A channel of the TFT 150 may be formed in the semiconductor 142 between the source electrode 165 and the drain electrode 166.

The display device according to another exemplary embodiment may include the source electrode 165 on the same line as the data line 162 and the drain electrode 166 extending in parallel to the data line 162, thereby increasing a width of the TFT without increasing an area occupied by the data wirings 162, 165, and 166, and thus increasing an aperture ratio of the display device.

In an exemplary embodiment, the data line 162 and the drain electrode 166 may include, more particularly, a refractory metal such as molybdenum (Mo), chromium (Cr), tantalum (Ta) and titanium (Ti) or an alloy thereof, and may have a multilayer structure including a refractory metal layer and a low-resistance conductive layer, for example. The data line 162 and the drain electrode 166 may include various other metals or conductive materials in addition to the aforementioned materials.

The pixel area may be defined by the data line 162 and the gate line 122, however, the pixel area is not limited thereto. The pixel area may be defined by a black matrix (not illustrated). In an exemplary embodiment, the pixel area may include a red pixel area, a green pixel area, and a blue pixel area, for example. However, the invention is not limited thereto, and the pixel area may include a white pixel area, for example.

The first passivation layer 171 may be disposed over the data wirings 162, 165, and 166 and the ES 168. In detail, the first passivation layer 171 may be disposed on the source electrode 165, the drain electrode 166, and the ES 168. The first passivation layer 171 may include an organic insulating material and an inorganic insulating material.

Figure 8:
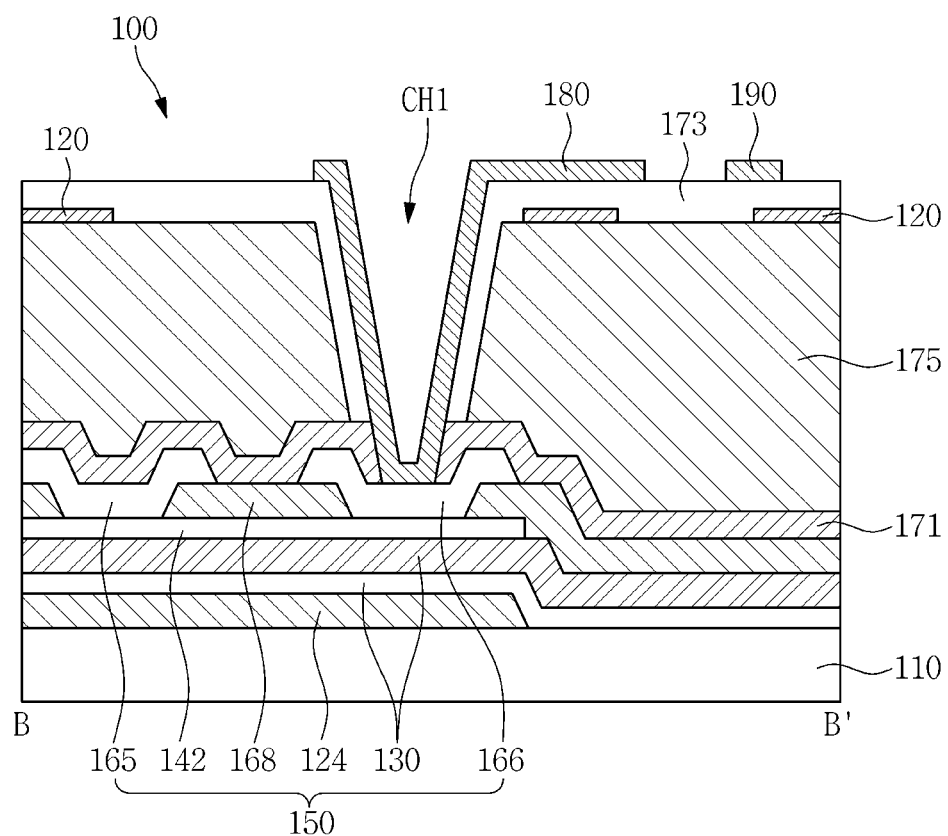
FIG. 8 is a cross-sectional view taken along line B-B' of FIG. 7.

In addition, the structure of the TFT 150 illustrated in FIG. 8 is given by way of example, and is not limited thereto.

The planarization layer 175 may be disposed on the first passivation layer 171. In an exemplary embodiment, the planarization layer 175 may have a monolayer or multilayer structure including silicon oxide ($SiO_x$), silicon nitride ($SiN_x$), an organic material having photosensitivity, a low-dielectric-constant insulating material such as a-Si:C:O or a-Si:O:F, or the like.

The planarization layer 175 may serve to planarize an upper portion of the TFT 150. In a case in which the upper portion of the TFT 150 is planarized by the first passivation layer 171, the planarization layer 175 may be omitted.

The lower common electrode 120 may be disposed on the planarization layer 175. The lower common electrode 120 may have a planar shape without a curvature. Lower common electrodes 120 on adjacent pixels may be connected to one another to thereby receive common voltages having a predetermined level supplied from an outside of the display area.

The second passivation layer 173 may be disposed to cover the lower common electrode 120. The second passivation layer 173 may include an organic insulating material or an inorganic insulating material.

The first sub-pixel electrode 180 and the second sub-pixel electrode 190 may be disposed on the second passivation layer 173. In an exemplary embodiment, the first sub-pixel electrode 180 and the second sub-pixel electrode 190 may include a transparent conductive material such as ITO, IZO, or the like. The first sub-pixel electrode 180 and the second sub-pixel electrode 190 may be alternately formed at predetermined intervals on the same layer, and may be substantially parallel to one another.

Since the disposition relationship among the lower common electrode COM, the first sub-pixel electrode $P_1$, and the second sub-pixel electrode $P_2$, and the formation of the electric field are described with reference to FIG. 2, the repetitive description will be omitted.

A first contact hole CH1 through which the drain electrode 166 is exposed may be defined in the first passivation layer 171, the planarization layer 175, the second passivation layer 173. In detail, the first sub-pixel electrode 180 may be physically and/or electrically connected to the drain electrode 166 through the first contact hole CH1, and may receive a first data voltage from a first drain electrode.

Although not illustrated, a lower alignment layer may be disposed on the first and second sub-pixel electrodes 180 and 190 and the second passivation layer 173. In an exemplary embodiment, the lower alignment layer may include a photo-reactive material, for example. In an exemplary embodiment, the lower alignment layer may include at least one of polyamic acid, polysiloxane, and polyimide.

Figure 9:
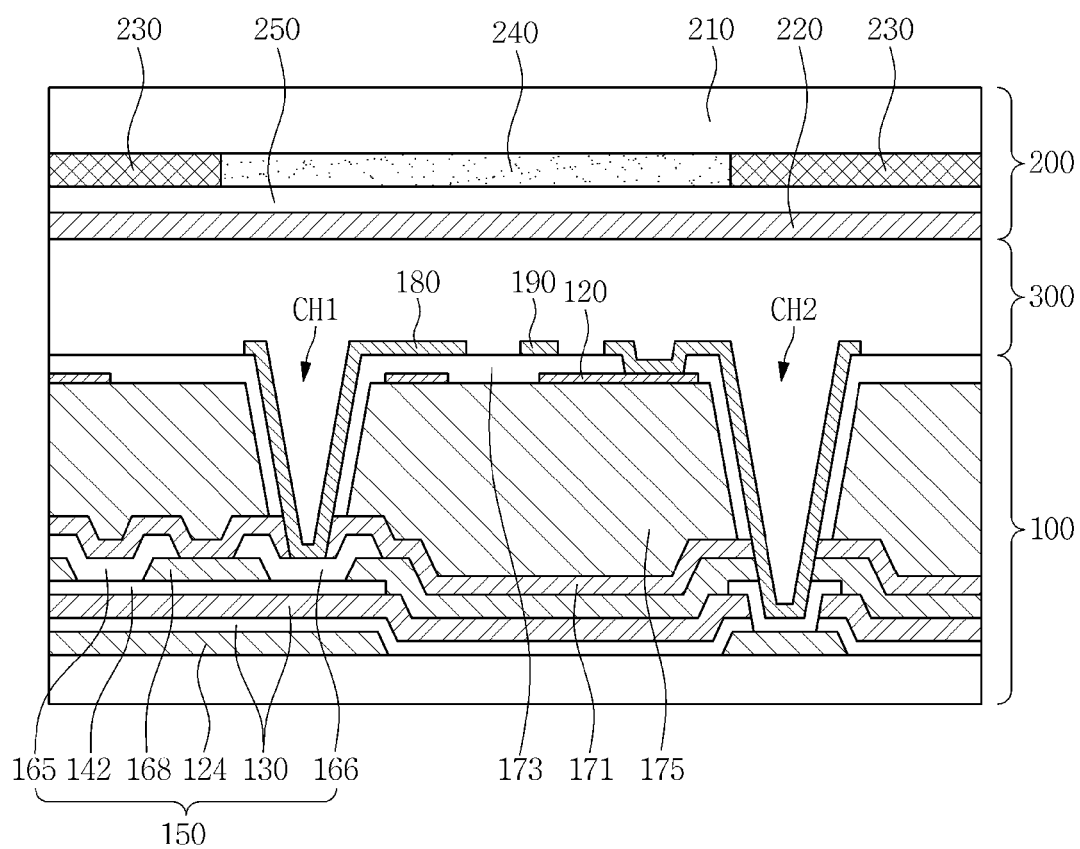
FIG. 9 is a cross-sectional view illustrating a display device according to another exemplary embodiment.

FIG. 9 is a cross-sectional view illustrating the display device according to another exemplary embodiment.

The display device according to an exemplary embodiment may include a lower panel 100, an upper panel 200, and an LC layer 300 between the lower panel 100 and the upper panel 200.

Since the lower panel 100 is described in the foregoing with reference to FIGS. 7 and 8, the repetitive description will be omitted for conciseness.

The upper panel 200 may include a second substrate 210, a light shielding layer 230, a color filter 240, an overcoat layer 250, and an upper common electrode 220.

In an exemplary embodiment, the second substrate 210 may include a transparent material such as glass or plastic.

The light shielding layer 230 may be disposed on the second substrate 210.

The light shielding layer 230, also referred to as a black matrix, may divide a plurality of color filters 240 and may define a pixel area.

In addition, the light shielding layer 230 may serve to prevent light supplied from a backlight unit (not illustrated) from being transmitted externally, and may prevent external light from being irradiated to the gate line 122, the data line 162, or the TFT 150. The light shielding layer 230 may be disposed to overlap the gate line 122, the data line 162, and the TFT 150. In an exemplary embodiment, the light shielding layer 230 may have a lattice structure in which the light shielding layers 230 are arranged along the gate line 122 and the data line 162.

The color filter 240 may be disposed in the pixel area divided by the light shielding layer 230. In an exemplary embodiment, the color filter 240 may include a red color filter, a green color filter, and a blue color filter, by way of example. However, the type of the color filter 240 is not limited thereto.

The red color filter, the green color filter, and the blue color filter may be disposed corresponding to a red pixel area, a green pixel area, and a blue pixel area, respectively.

The overcoat layer 250 may be disposed on the color filter 240. The overcoat layer 250 may planarize an upper portion of the color filter 240, and may protect the color filter 240. In an exemplary embodiment, the overcoat layer 250 may be, for example, including an acrylic epoxy material.

The upper common electrode 220 may be disposed on the overcoat layer 250.

In an exemplary embodiment, the upper common electrode 220 may include a TCO such as ITO, IZO or AZO.

The upper common electrode 220 may serve to reduce image retention by dispersing an electric field which is concentrated on end portions of the first sub-pixel electrode 180 and the second sub-pixel electrode 190. Since the upper common electrode 220 is described in the foregoing with reference to FIG. 3, the repetitive description will be omitted for conciseness.

Although not illustrated, the upper panel 200 may further include an upper alignment layer. The upper alignment layer may be disposed on the upper common electrode 220. The upper alignment layer may include the same material forming the lower alignment layer.

A column spacer may be disposed between the lower panel 100 and the upper panel 200. The column spacer may maintain a predetermined interval between the lower panel 100 and the upper panel 200, thereby maintaining a cell gap of the display device.

When surfaces of the first substrate 110 and the second substrate 210 that face each other are defined as upper surfaces of the corresponding substrates, respectively, and surfaces of the first substrate 110 and the second substrate 210 opposite to the upper surfaces thereof are defined as lower surfaces of the corresponding substrates, respectively, an upper polarizer may be further disposed on the lower surface of the first substrate 110, and a lower polarizer (not illustrated) may be further disposed on the lower surface of the second substrate 210.

The LC layer 300 may be disposed in the interval between the lower panel 100 and the upper panel 200. Since the LC layer 300 is described in the foregoing with reference to FIG. 3, the repetitive description will be omitted for conciseness.

Figure 10:
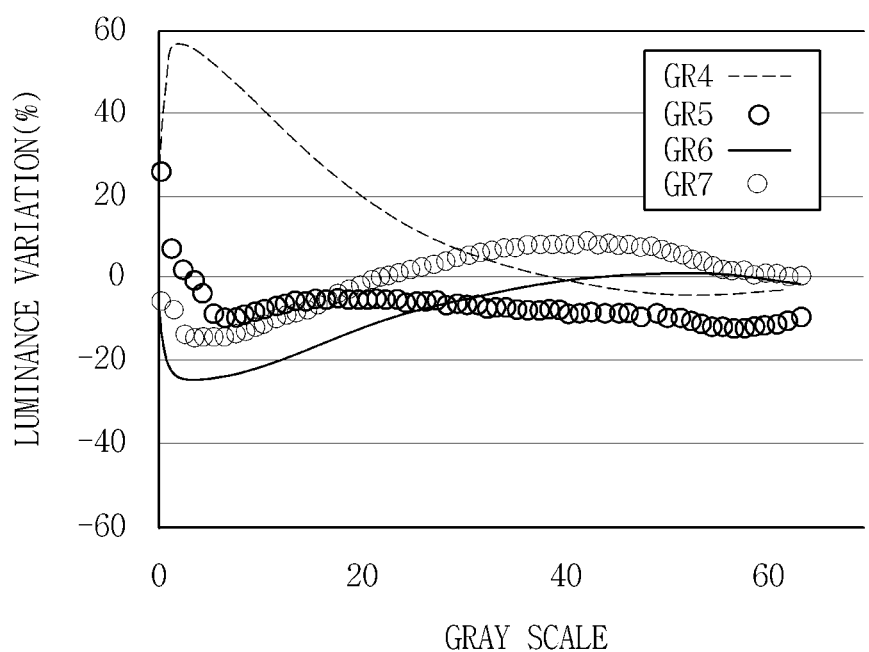
FIG. 10 illustrates graphs of a luminance variation based on a CD variation in a pixel.

FIG. 10 illustrates graphs of a luminance variation based on a CD variation in a pixel.

In FIG. 10, an x axis may represent a gray scale and a y axis may represent a luminance variation. A fifth graph GR5 and a sixth graph GR6 may represent a result of measuring a luminance variation with respect to a gray scale of the display device according to the exemplary embodiment based on a CD variation of about ±0.6 μm in a pixel. A fourth graph GR4 and a seventh graph GR7 may represent a result of measuring a luminance variation with respect to a gray scale of a conventional display device based on a CD variation of about ±0.6 μm in a pixel.

Referring to FIG. 10, while the fifth graph GR5 and the sixth graph GR6 exhibit a relatively small luminance variation with respect to a gray scale based on a CD variation in a pixel, the fourth graph GR4 and the seventh graph GR7 exhibit a relatively great luminance variation with respect to a gray scale based on a CD variation in a pixel. In other words, the luminance variation with respect to the gray scale of the display device according to the exemplary embodiment may be less than that of the conventional display device.

The display device according to another exemplary embodiment may include both of an area (with the lower common electrode) in which a luminance increases based on a CD variation within a pixel and an area (without the lower common electrode) in which a luminance decreases based on a CD variation within a pixel. Accordingly, the display device according to the exemplary embodiment may have a compensation effect with respect to the luminance increase and the luminance decrease based on a CD distribution.

The display device according to another exemplary embodiment may reduce the luminance variation with respect to the gray scale based on the CD distribution in the pixel by compensating for the luminance variation based on the presence of the lower common electrode.

As set forth above, according to one or more exemplary embodiments, the display device may reduce a luminance distribution deviation by forming a horizontal electric field area and a fringe electric field area within a pixel.

In addition, the display device may reduce image retention by dispersing electric fields concentrated on both ends of the pixel electrode through the use of the upper common electrode on the second substrate.

Accordingly, the display device may enhance luminance uniformity and may reduce image retention.

From the foregoing, it will be appreciated that various embodiments in accordance with the disclosure have been described herein for purposes of illustration, and that various modifications may be made without departing from the scope and spirit of the teachings. Accordingly, the various embodiments disclosed herein are not intended to be limiting of the true scope and spirit of the teachings. Various features of the above described and other embodiments can be mixed and matched in any manner, to produce further embodiments consistent with the invention.

What is claimed is:

1. A display device comprising:
    a first substrate;
    a first gate line on the first substrate;
    first and second data lines intersecting the first gate line;
    a first thin film transistor connected to the first gate line and the first data line;
    a second thin film transistor connected to the first gate line and the second data line;
    a first passivation layer on the first and second thin film transistors;
    a lower common electrode on the first passivation layer;
    a second passivation layer covering the lower common electrode; and
    a first pixel electrode including a first sub-pixel electrode connected to the first thin film transistor and a second sub-pixel electrode connected to the second thin film transistor,
    wherein at least a portion of the first sub-pixel electrode and at least a portion of the second sub-pixel electrode each overlap the lower common electrode,
    wherein the first sub-pixel electrode has first and second sides, the first side faces the second side, the second side is positioned more adjacently to the second sub-pixel electrode than the first side, and the lower common electrode overlaps the first side more than the second side.

2. The display device of claim 1, wherein the first and second sub-pixel electrodes each overlap an edge of the lower common electrode.

3. The display device of claim 2, wherein the first sub-pixel electrode overlaps the lower common electrode by less than a half of a width of the first sub-pixel electrode, and the second sub-pixel electrode overlaps the lower common electrode by less than half a width of the second sub-pixel electrode.

4. The display device of claim 3, wherein the lower common electrode is absent in an area between the first and second sub-pixel electrodes.

5. The display device of claim 1, wherein the lower common electrode overlaps the first and second data lines.

6. The display device of claim 1, wherein the lower common electrode is separated from the first and second thin film transistors in a plan view.

7. The display device of claim 1, wherein the lower common electrode has a width wider than a width of each of the first and second sub-pixel electrodes.

8. The display device of claim 1, wherein a width of each of the first and second sub-pixel electrodes is smaller than an interval between the first and second sub-pixel electrodes.

9. The display device of claim 1, wherein the first and second sub-pixel electrodes are disposed on a same layer and adjacent to each other.

10. The display device of claim 1, wherein the first and second sub-pixel electrodes are substantially parallel to each other.

11. The display device of claim 1, wherein the first and second sub-pixel electrodes receive voltages having a same level and different polarities.

12. The display device of claim 1, further comprising:
a second substrate opposing the first substrate;
a liquid crystal layer between the first substrate and the second substrate; and
an upper common electrode on the second substrate.

13. The display device of claim 12, wherein the liquid crystal layer is a homeotropic alignment layer.

14. The display device of claim 12, wherein the liquid crystal layer has a negative dielectric anisotropy.

15. The display device of claim 1, further comprising:
a second gate line substantially parallel to the first gate line;
a third data line opposing the first data line with reference to the second data line therebetween;
a third thin film transistor connected to the second data line and the second gate line;
a fourth thin film transistor connected to the second gate line and the third data line; and
a second pixel electrode including a third sub-pixel electrode connected to the third thin film transistor and a fourth sub-pixel electrode connected to the fourth thin film transistor.

16. The display device of claim 15, wherein the second gate line overlaps an end portion of the first sub-pixel electrode and an end portion of the second sub-pixel electrode.

17. The display device of claim 15, wherein the third thin film transistor and the fourth thin film transistor are separated from the lower common electrode in a plan view.

18. The display device of claim 15, wherein the lower common electrode overlaps the third data line.

19. The display device of claim 1, wherein only a portion of less than substantially all of the first sub-pixel electrode and only a portion less than substantially all of the second sub-pixel electrode each overlap the lower common electrode.

* * * * *